United States Patent
Mueller

(10) Patent No.: US 9,818,663 B2
(45) Date of Patent: Nov. 14, 2017

(54) SILICONE COMPOSITION WITH PROTECTION AGAINST POLLUTANTS

(71) Applicant: Wacker Chemie AG, Munich (DE)

(72) Inventor: Philipp Mueller, Burghausen (DE)

(73) Assignee: WACKER CHEMIE AG, Munich (DE)

( * ) Notice: Subject to any disclaimer, the term of this patent is extended or adjusted under 35 U.S.C. 154(b) by 470 days.

(21) Appl. No.: 14/395,365

(22) PCT Filed: Apr. 4, 2013

(86) PCT No.: PCT/EP2013/057146
§ 371 (c)(1),
(2) Date: Oct. 17, 2014

(87) PCT Pub. No.: WO2013/160081
PCT Pub. Date: Oct. 31, 2013

(65) Prior Publication Data
US 2015/0132586 A1    May 14, 2015

(30) Foreign Application Priority Data
Apr. 26, 2012 (DE) .......... 10 2012 206 968

(51) Int. Cl.
| H01L 23/29 | (2006.01) |
| C09D 183/04 | (2006.01) |
| C08L 83/04 | (2006.01) |
| C08K 9/02 | (2006.01) |
| C09D 7/12 | (2006.01) |
| C08G 77/12 | (2006.01) |
| C08G 77/20 | (2006.01) |

(52) U.S. Cl.
CPC .............. *H01L 23/296* (2013.01); *C08K 9/02* (2013.01); *C08L 83/04* (2013.01); *C09D 7/1225* (2013.01); *C09D 183/04* (2013.01); *C08G 77/12* (2013.01); *C08G 77/20* (2013.01); *Y10T 428/31663* (2015.04)

(58) Field of Classification Search
CPC ...................................................... H01L 23/296
USPC ........................................................... 524/588
See application file for complete search history.

(56) References Cited

U.S. PATENT DOCUMENTS

2010/0072416 A1* 3/2010 Fujioka ................ C08L 101/12
   252/67
2010/0196487 A1* 8/2010 Voss ....................... A01N 59/16
   424/489

FOREIGN PATENT DOCUMENTS

| CN | 101125688 A | 2/2008 |
| CN | 102020421 A | 4/2011 |
| EP | 0367562 A2 | 5/1990 |
| EP | 1039480 A1 | 9/2000 |
| EP | 1295905 A1 | 3/2003 |
| JP | 07-233361 A * | 9/1995 |

OTHER PUBLICATIONS

Abstract for JP 04-145007 (May 1992).*
Abstract for CN 101108676 (Jan. 2008).*
Machine translation of JP 07-233361 (no date).*

* cited by examiner

Primary Examiner — Marc Zimmer
(74) Attorney, Agent, or Firm — Brooks Kushman P.C.

(57) ABSTRACT

Addition-curable encapsulants for electrical and electronic components contain amorphous glass particles doped with silver, and are efficient scavengers of sulfur and sulfur compounds.

4 Claims, No Drawings

SILICONE COMPOSITION WITH PROTECTION AGAINST POLLUTANTS

CROSS REFERENCE TO RELATED APPLICATIONS

This application is the U.S. National Phase of PCT Appln. No. PCT/EP2013/057146 filed Apr. 4, 2013, which claims priority to German Application No. 10 2012 206 968.2 filed Apr. 26, 2012, the disclosures of which are incorporated in their entirety by reference herein.

BACKGROUND OF THE INVENTION

1. Field of the Invention

The invention relates to addition-crosslinking silicone compositions which can provide protective encapsulation of electrical and electronic components exposed to a highly corrosive environment.

2. Description of the Related Art

Large quantities of silicone encapsulation compositions are used to protect electronic circuits from corrosion. Another situation that has become increasingly prevalent is exposure of electronic components to particularly aggressive, sulfur-containing pollutant gases. The silicone encapsulation compositions available hitherto have high permeability to sulfur, hydrogen sulfide, sulfur dioxide, carbon disulfide, and other organylsulfur compounds, and corrosion of the metallic conductors therefore causes failure and shortened lifetimes of these components.

EP1295905A1 describes silicone encapsulation compositions which comprise pulverulent metallic fillers, Cu powder being described here as particularly preferred. However, the solution proposed here using purely metallic surfaces is still insufficiently effective, because only a relatively small effective surface area of the metal is available for the sulfur-gas-scavenging reaction. This solution is moreover associated with numerous further disadvantages such as high price, high density, and adverse attenuation characteristics.

SUMMARY OF THE INVENTION

It was therefore an object to provide a silicone composition which does not exhibit the abovementioned disadvantages and which provides good protection of electronic components from sulfur-containing pollutant gases. Surprisingly, these and other objects have been achieved via addition-crosslinking silicone compositions comprising
(A) from 30 to 95% by weight of linear compounds which contain moieties having aliphatic carbon-carbon multiple bonds,
(B) from 0.1 to 20% by weight of linear organopolysiloxanes having Si-bonded hydrogen atoms,
or instead of (A) and (B)
(C) from 30 to 95% by weight of linear organopolysiloxanes which have SiC-bonded moieties having aliphatic carbon-carbon multiple bonds and Si-bonded hydrogen atoms,
(D) at least one hydrosilylation catalyst, and
(E) from 5 to 70% by weight of filler made of porous silver-doped glass particles, where from 5 to 50% by weight of the silver has been doped in ionic form.

DETAILED DESCRIPTION OF THE PREFERRED EMBODIMENTS

The compositions of the invention can be single-component silicone compositions or two-component silicone compositions. In the latter case, the two components of the compositions of the invention can comprise all of the constituents in any desired combination, generally with the proviso that a component does not simultaneously comprise siloxanes having an aliphatic multiple bond, siloxanes having Si-bonded hydrogen, and catalyst, i.e. in essence does not simultaneously comprise the constituents (A), (B), and (D) or, respectively, (C) and (D). However, it is preferable that the compositions of the invention are single-component compositions. The single-component silicone elastomer compositions of the invention are produced via mixing of the constituents, via mixing of components (A), (B), (D), and (E), or (C), (D), and (E) as in the prior art.

The compounds (A) and (B) or, respectively, (C) used in the addition-crosslinking compositions of the invention are selected in a known manner so as to permit crosslinking: by way of example, compound (A) has at least two aliphatically unsaturated moieties and (B) has at least three Si-bonded hydrogen atoms, or compound (A) has at least three aliphatically unsaturated moieties and siloxane (B) has at least two Si-bonded hydrogen atoms, or else siloxane (C) is used instead of compound (A) and (B) and has aliphatically unsaturated moieties and Si-bonded hydrogen atoms in the abovementioned ratios. Another possibility is mixtures of (A) and (B) and (C) using the abovementioned ratios of aliphatically unsaturated moieties and Si-bonded hydrogen atoms.

It is preferable that the silicone compositions of the invention comprise, as constituent (A), at least one aliphatically unsaturated linear organosilicon compound, and it is possible here to use any of the aliphatically unsaturated linear organosilicon compounds used hitherto in addition-crosslinking compositions.

Organosilicon compounds (A) used which have SiC-bonded moieties having aliphatic carbon-carbon multiple bonds are preferably linear organopolysiloxanes made of units of the general formula (II)

$$R_a R^1{}_b SiO_{(4-a-b)/2} \qquad (II)$$

where
R are mutually independently identical or different organic or inorganic moieties free from aliphatic carbon-carbon multiple bonds,
$R^1$ are mutually independently identical or different monovalent, substituted or unsubstituted, SiC-bonded hydrocarbon moieties having at least one aliphatic carbon-carbon multiple bond,
a is 1, 2, or 3, and
b is 1 or 2,
with the proviso that the sum a+b is less than or equal to 3, and at least 2 moieties $R^1$ are present in each molecule.

Moiety R can be mono- or polyvalent moieties, and the polyvalent moieties, for example bivalent, trivalent, and tetravalent moieties, then bond a plurality of siloxy units of the formula (II) to one another, for example 2, 3, or 4 siloxy units.

Other examples of R are the monovalent moieties —F, —Cl, —Br, —$OR^2$, —CN, —SCN, —NCO, and SiC-bonded substituted or unsubstituted hydrocarbon moieties which can be interrupted by oxygen atoms or by the group —C(O)—; other examples of R are divalent moieties Si-bonded on both sides as in formula (II). If moiety R is an SiC-bonded, substituted hydrocarbon moiety, preferred substituents are halogen atoms, phosphorus-containing moieties, cyano moieties, —$OR^2$, —$NR^2$—, —$NR^2{}_2$, —$NR^2$—C(O)—$NR^2{}_2$, —C(O)—$NR^2{}_2$, —C(O)$R^2$, —C(O)$OR^2$, —$SO_2$-Ph, and —$C_6F_5$. $R^2$ are mutually independently, identical or different, and are hydrogen or monovalent hydrocarbon moieties having from 1 to 20 carbon atoms. Ph is the phenyl moiety.

Examples of moieties R are alkyl moieties, for example the methyl, ethyl, n-propyl, isopropyl, n-butyl, isobutyl, tert-butyl, n-pentyl, isopentyl, neopentyl, and tert-pentyl moieties, hexyl moieties such as the n-hexyl moiety, heptyl moieties such as the n-heptyl moiety, octyl moieties such as the n-octyl moiety and isooctyl moieties such as the 2,2,4-trimethylpentyl moiety, nonyl moieties such as the n-nonyl moiety, decyl moieties such as the n-decyl moiety, dodecyl moieties such as the n-dodecyl moiety, and octadecyl moieties such as the n-octadecyl moiety, cycloalkyl moieties such as the cyclopentyl, cyclohexyl, cycloheptyl, and methylcyclohexyl moieties; aryl moietiese such as the phenyl, naphthyl, anthryl, and phenanthryl moieties; alkaryl moieties such as the o-, m-, p-tolyl moieties, xylyl moieties, and ethylphenyl moieties; and aralkyl moieties, for example the benzyl moiety, and the α- and the β-phenylethyl moieties.

Examples of substituted moieties R are haloalkyl moieties, for example the 3,3,3-trifluoro-n-propyl moiety, the 2,2,2,2',2',2'-hexafluoroisopropyl moiety, and the heptafluoroisopropyl moiety; haloaryl moieties, for example the o-, m-, and p-chlorophenyl moieties, —(CH$_2$)—N(R$^2$)C(O) NR$^2_2$, —(CH$_2$)$_n$—C(O)NR$^2_2$, —(CH$_2$)$_n$—C(O)R$^2$, —(CH$_2$)$_n$—C(O)OR$^2$, —(CH$_2$)$_n$—C(O)NR$^2_2$, —(CH$_2$)—C(O)—(CH$_2$)$_m$C(O)CH$_3$, —(CH$_2$)—O—CO—R$^2$, —(CH$_2$)—NR$^2$—(CH$_2$)$_m$—NR$^2_2$, —(CH$_2$)$_n$—O—(CH$_2$)$_m$CH(OH)CH$_2$OH, —(CH$_2$)$_n$(OCH$_2$CH$_2$)$_m$OR$^2$, —(CH$_2$)$_n$—SO$_2$-Ph, and —(CH$_2$)$_n$—O—C$_6$F$_5$, where R$^2$ and Ph are defined as above, and n and m are identical or different integers from 0 to 10.

Examples of R as a divalent moiety Si-bonded on both sides as in formula (II) are moieties derived from the monovalent examples of moiety R above in that an additional bond replaces a hydrogen atom, examples of moieties of this type being —(CH$_2$)—, —CH(CH$_3$)—, —C(CH$_3$)$_2$—, —CH(CH$_3$)—CH$_2$—, —C$_6$H$_4$—, —CH(Ph)-CH$_2$—, —C(CF$_3$)$_2$—, —(CH$_2$)$_n$—C$_6$H$_4$—(CH$_2$)$_n$—, —(CH$_2$)$_n$—C$_6$H$_4$—C$_6$H$_4$—(CH$_2$)$_n$—, —(CH$_2$O)$_m$, (CH$_2$CH$_2$O)$_m$, —(CH$_2$)$_n$—O$_x$—C$_6$H$_4$—SO$_2$—C$_6$H$_4$—O$_x$—(CH$_2$)$_n$—, where x is 0 or 1, and Ph, m, and n are defined as above.

It is preferable that moiety R is a monovalent, SiC-bonded, optionally substituted hydrocarbon moiety having from 1 to 18 carbon atoms and free from aliphatic carbon-carbon multiple bonds, particularly a monovalent, SiC-bonded, hydrocarbon moiety having from 1 to 6 carbon atoms and free from aliphatic carbon-carbon multiple bonds, in particular the methyl or phenyl moiety.

Moiety R$^1$ can be any desired group amenable to an addition reaction (hydrosilylation) with an SiH-functional compound.

If moiety R$^1$ is an SiC-bonded, substituted hydrocarbon moiety, preferred substituents are halogen atoms, cyano moieties, and —OR$^2$, where R$^2$ is as defined above.

It is preferable that moiety R$^1$ is an alkenyl or alkynyl group having from 2 to 16 carbon atoms, for example vinyl, allyl, methallyl, 1-propenyl, 5-hexenyl, ethynyl, butadienyl, hexadienyl, cyclopentenyl, cyclopentadienyl, cyclohexenyl, vinylcyclohexylethyl, divinylcyclohexylethyl, norbornenyl, vinylphenyl, and styryl moieties, and it is particularly preferable here to use vinyl, allyl, and hexenyl moieties.

The molar mass of the constituent (A) can vary widely, for example from 10$^2$ to 10$^6$ g/mol: The constituent (A) can by way of example be a relatively low-molecular-weight alkenyl-functional oligosiloxane, for example 1,2-divinyltetramethyldisiloxane but can also be a high-polymeric polydimethylsiloxane having Si-bonded vinyl groups within the chain or at chain ends, and having a molar mass of, for example, 10$^5$ g/mol (number average determined by means of NMR).

The addition-crosslinking silicone composition of the invention preferably comprises from 30 to 80% by weight of (A), more preferably from 40 to 70% by weight of (A).

Organosilicon compound (B) used can be any of the hydrogen-functional organosilicon compounds used hitherto in addition-crosslinkable compositions.

Organopolysiloxanes (B) used which have Si-bonded hydrogen atoms are preferably linear organopolysiloxanes made of units of the general formula (III)

where
R is defined as above,
c is 0, 1, 2 or 3, and
d is 0, 1, or 2,
with the proviso that the sum c+d is less than or equal to 3, and at least two Si-bonded hydrogen atoms are present in every molecule.

It is preferable that the organopolysiloxane (B) used in the invention comprises a quantity in the range from 0.02 to 1.7% by weight of Si-bonded hydrogen, based on the total weight of the organopolysiloxane (B).

The molar mass of the constituent (B) can likewise vary widely, for example from 10$^2$ to 10$^6$ g/mol: The constituent (B) can by way of example be a relatively low-molecular-weight SiH-functional oligosiloxane, for example tetramethyldisiloxane but can also be a high-polymeric polydimethylsiloxane having SiH groups within the chain or at chain ends, or a silicone resin having SiH groups.

There is moreover no defined structure of the molecules forming the constituent (B); in particular, the structure of a relatively high-molecular-weight, i.e. oligomeric or polymeric, SiH-containing siloxane can be linear. Linear polysiloxanes (B) are preferably composed of units of the formula R$_3$SiO$_{1/2}$, HR$_2$SiO$_{1/2}$, HRSiO$_{2/2}$, and R$_2$SiO$_{2/2}$, where R is defined as above.

It is also possible, of course, to use mixtures of different siloxanes complying with the criteria for the constituent (B). In particular, the molecules forming the constituent (B) can optionally also simultaneously comprise aliphatically unsaturated groups in addition to the obligatory SiH groups. Particular preference is given to the use of low-molecular-weight SiH-functional compounds such as tetrakis(dimethylsiloxy)silane and tetramethylcyclotetrasiloxane, and also of relatively high-molecular-weight, SiH-containing siloxanes, for example poly(hydrogenmethyl)siloxane and poly(dimethylhydrogenmethyl)siloxane with viscosity of from 10 to 10,000 mPa·s at 25° C., or analogous SiH-containing compounds in which some of the methyl groups have been replaced by 3,3,3-trifluoropropyl or phenyl groups.

The addition-crosslinking silicone composition of the invention preferably comprises from 0.5 to 20% by weight of (B), particularly from 1 to 15% by weight of (B).

The quantity of constituent (B) in the crosslinkable silicone compositions of the invention is preferably such that the molar ratio of SiH groups to aliphatically unsaturated groups from (A) is from 0.1 to 20, particularly from 0.2 to 2.0. Components (A) and (B) used in the invention are commercially available products or can be produced by processes that are commonly used in chemistry.

The silicone compositions of the invention can comprise, instead of component (A) and (B), linear organopolysiloxanes (C) which simultaneously have aliphatic carbon-carbon multiple bonds and Si-bonded hydrogen atoms. The silicone compositions of the invention can also comprise all three of components (A), (B), and (C).

If siloxanes (C) are used, these are preferably those made of units of the general formulae (IV), (V), and (VI)

$$R_f SiO_{4/2} \tag{IV}$$

$$R_g R^1 SiO_{3-g/w} \tag{V}$$

$$R_h HSiO_{3-h/2} \tag{VI}$$

where
R and $R^1$ are defined as above,
f is 1, 2, or 3,
g is 1 or 2, and
h is 1 or 2,
with the proviso that at least 2 moieties $R^1$ and at least 2 Si-bonded hydrogen atoms are present in every molecule.

The addition-crosslinking silicone composition of the invention preferably comprises from 30 to 80% by weight of (C), particularly from 40 to 70% by weight of (C).

It is preferable that the average viscosity of the organopolysiloxanes (C) is from 0.01 to 500,000 Pa·s, particularly from 0.1 to 100,000 Pa·s, in each case at 25° C. Organopolysiloxanes (C) can be produced by methods commonly used in chemistry.

Hydrosilylation catalyst (D) used can be any of the catalysts useful in hydrosilylation reactions. Component (D) can be a platinum group metal, for example platinum, rhodium, ruthenium, palladium, osmium, or iridium, an organometallic compound, or a combination thereof. Examples of component (D) are compounds such as hexachloroplatinic acid, platinum dichloride, platinum acetylacetonate, and complexes of said compounds, encapsulated within a matrix or within a core-shell-type structure. Among the platinum complexes with organopolysiloxanes of low molecular weight are platinum 1,3-diethenyl-1,1,3,3-tetramethyldisiloxane complexes. Other examples are platinum phosphite complexes, platinum phosphine complexes, and alkylplatinum complexes. These compounds can have been encapsulated within a resin matrix.

The quantity of component (D) can be from 0.1 to 1000 parts per million (ppm), from 0.5 to 100 ppm, or from 1 to 25 ppm, of the platinum group metal, based on the total weight of the components. The curing rate can be low when the platinum group metal constituent is below 1 ppm. Use of more than 100 ppm of the platinum group metal is uneconomical, or can reduce the stability of the composition.

In the filler made of porous glass particles (E), the density of the lattice of the glass matrix of these glasses that, for the purposes of the invention are porous, is from 1.0 to 3.0 g/cm$^3$. The associated pore diameter is from $1.0 \times 10^{-10}$ m to $20 \times 10^{-10}$ m, i.e. from 1 to 20 Angstroms.

The doped glass particles (E) are produced via comminution of foamed glass until the average particle size is from 1 to 50 μm, preferably from 2 to 15 μm, and subsequent mixing with a dissolved silver salt, preferably silver nitrate solution. Quantities of the silver salt solution incorporated into the mixture, based on the glass particles, are from 1 to 15% by weight, preferably from 4 to 7% by weight. The porosity of the glass particles causes these to absorb the silver solution. No clumping of the glass particles occurs here. A conditioning/drying process then takes place in order to fix some of the silver ions on the pore walls of the glass particles by way of ionic bonding, and to reduce the moisture content of the silver-containing porous glass particles.

The silver content of the porous glass particles is from 0.5 to 30% by weight, preferably from 1 to 10% by weight, based on (E).

The amount of the introduced silver in ionic form which is present as silver ions, is preferably from 5 to 50% by weight, more preferably from 15 to 35% by weight.

The silicone elastomer composition of the invention can, if desired, comprise a proportion of from 0 up to 70% by weight, preferably from 1 to 40% by weight, of other additives (F) as constituents. These additives can be reinforcing and inert fillers differing from (E), rheology-modifying additives, flame retardants, agents for influencing electrical properties, dispersing agents, solvents, adhesion promoters, pigments, dyes, plasticizers, organic polymers, heat stabilizers, etc. Examples of adhesion promoters that can be used as additional substances (F) are silanes having hydrolyzable groups and SiC-bonded vinyl, acryloxy, methacryloxy, epoxy, anhydride, acid, ester, or ether groups; other examples of these adhesion promoters are partial hydrolyzates and cohydrolyzates, preference being given here to silanes having vinyl groups and silanes having epoxy groups which comprise ethoxy or acetoxy groups as hydrolyzable moieties, particular preference being given here to vinyltriethoxysilane, vinyltriacetoxysilane, epoxypropyltrimethoxysilane, and their partial hydrolyzates and cohydrolyzates. Quantities of adhesion promoters (F) in the silicone composition of the invention are preferably from 0 to 5% by weight, with preference from 0.3 to 3% by weight.

The combination of porous surface structure with silver doping which provides the silver predominantly in ionic form in order to bind the sulfur-containing pollutant gases has proven to be particularly effective for protecting encapsulated electronic components from sulfur-containing pollutant gases. By virtue of component (E) with its porous surface structure, the addition-crosslinking silicone compositions of the invention provide a markedly larger effective surface area for the adsorption of pollutant gases. The silver predominantly present in ionic form has also proven to be particularly advantageous, alongside the increased surface area of said fillers, for the protection of metallic surfaces from sulfur-containing pollutant gas.

The compositions of the invention are used for the encapsulation of electrical or electronic components.

The present invention therefore further provides encapsulated electrical or electronic components characterized in that the encapsulation material is a polymerized silicone composition of the invention.

EXAMPLES

Unless otherwise stated in the examples described below, all parts and percentages stated are based on weight. Unless otherwise stated, the examples below are carried out at the pressure of the ambient atmosphere, i.e. at about 1000 hPa, and at room temperature, i.e. at about 20° C., or at a temperature that becomes established when the reactants are combined at room temperature without additional heating or cooling. All viscosities below relate to dynamic viscosity at a temperature of 20° C. and at a shear rate of 1 s$^{-1}$. The examples below illustrate the invention, but without any resultant restrictive effect. All of the examples give the overall composition of the crosslinked products, irrespective of whether these are formulated as single- or two-component compositions.

Description of Raw Materials:

Vinylpolymers 1 and 2: These are vinyldimethylsiloxy-terminated dimethylpolysiloxanes with different viscosities, produced by conventional processes.

SiH crosslinking agent H018: This is a trimethylsilyl-terminated dimethyl/methylhydrocopolysiloxane with viscosity 180 mPa·s and 0.17% by weight H content.

H polymer: This is an H-dimethylsiloxy-terminated dimethylpolysiloxane with viscosity 65 mPa·s.

Catalyst masterbatch EP: Karstedt catalyst with 1% by weight of platinum in PDMS.

Filler 1: Amorphous, porous silicate glass particles, typical particle diameter about 10 μm, silver content 3.1% by weight, silver ion content 0.26 mg/L Filler 2: Amorphous, porous silicate glass particles, typical particle diameter about 10 μm, silver content 3.1% by weight, silver ion content 0.37 mg/L Filler 3: Amorphous, porous silicate glass particles, typical particle diameter about 10 μm, silver content 7.6% by weight, silver ion content 2.4 mg/L Filler 4: Spherical silicate glass particles coated with metallic silver, particle diameter from 15 to 50 μm, density 2.6 g/cm$^3$, silver content 8.0% by weight.

Filler 5: Spherical copper metal particles coated with metallic silver, particle diameter from 10 to 30 μm, silver content 17.0% by weight Description of Silicone Compositions and Tests:

The compositions were mixed in suitable mixers. After mixing, the silicone compositions were degassed for 5 min at 10 mbar. Filler content (fillers 1 to 5) was always 50% by weight, based on the entire formulation.

Corrosion test: The test substrates were composed of aluminum oxide ceramic of thickness 1 mm onto which undulating silver conductor tracks were printed. The track width of the conductor tracks was 0.5 mm. The flowable mixtures 1-6 are applied at a layer thickness of 2 mm to the test substrates, degassed, and hardened at 150° C. for 60 min. Soft silicone gels are obtained.

The test substrates were placed in a 1 L desiccator together with 1 g of elemental sulfur powder. The desiccator was sealed and heated to 80° C. for a total of 14 days.

At defined intervals, the test substrates were removed, the silicone gel was removed, and the silver conductor track was checked visually for corrosion.

The test sample was assessed as good (g) if the silver track had not discolored and had metallic luster.

The test sample was assessed as poor (p) if the silver track had discolored to become dark or black, indicating corrosion.

Table 1 shows the composition of examples 1-6, and also the corrosion test results.

Examples 1-4 of the invention: Silicone compositions with fillers made of amorphous, porous silicate particles and of predominantly ionic silver coating.

Example 5, not of the invention, with spherical silicate glass particles and metallic silver coating.

Example 6, not of the invention, with spherical copper metal particles and metallic silver coating by analogy with EP1295905A1.

Examples 1-4 of the invention show that only the silicone compositions of the invention with amorphous, porous silicate particles and with predominantly ionic silver doping can provide durable and lasting protection of the substrates to be protected, and therefore of the electronic components.

TABLE 1

Compositions in each case in parts by weight

| | Example | | | | | |
|---|---|---|---|---|---|---|
| | 1 | 2 | 3 | 4 | 5* | 6* |
| Vinyl polymer 1: 200 mPa · s | — | 100 | — | 100 | — | 100 |
| Vinyl polymer 2: 1000 mPas | 100 | — | 100 | — | 100 | — |
| H polymer: 65 mPa · s | — | 25 | — | 25 | — | 25 |
| SiH crosslinking agent H018 | 3.0 | 0.5 | 3.0 | 0.5 | 3.0 | 0.5 |
| Catalyst masterbatch EP | 0.2 | 0.2 | 0.2 | 0.2 | 0.2 | 0.2 |
| Filler 1 | 103.2 | 125.7 | — | — | — | — |
| Filler 2 | — | — | 103.2 | — | — | — |
| Filler 3 | — | — | — | 125.7 | — | — |
| Filler 4 | — | — | — | — | 103.2 | — |
| Filler 5 | — | — | — | — | — | 125.7 |
| Corrosion test | | | | | | |
| after 24 h | g | g | g | g | g | g |
| after 72 h | g | g | g | g | p | g |
| after 168 h | g | g | g | g | p | p |
| after 336 h | g | g | g | g | p | p |

*not of the invention

What is claimed is:

1. An addition-crosslinking silicone composition comprising
   (A) from 30 to 95% by weight of linear compounds which contain moieties having aliphatic carbon-carbon multiple bonds,
   (B) from 0.1 to 20% by weight of linear organopolysiloxanes having Si-bonded hydrogen atoms,
or instead of (A) and (B)
   (C) from 30 to 95% by weight of linear organopolysiloxanes which contain SiC-bonded moieties having aliphatic carbon-carbon multiple bonds and Si-bonded hydrogen atoms,
   (D) at least one hydrosilylation catalyst, and
   (E) from 5 to 70% by weight of filler comprising porous silver-doped glass particles, where from 5 to 35% by weight of the silver has been doped in ionic form.

2. A process for the production of an addition-crosslinking silicone composition of claim 1, comprising mixing components (A), (B), (D), and (E), or (C), (D), and (E).

3. A process for encapsulating electrical or electronic components, comprising encapsulating the electrical or electronic components with a composition of claim 1 and curing the composition.

4. An electrical or electronic component encapsulated with an encapsulation material, wherein the encapsulation material is a polymerized silicone composition of claim 1.

* * * * *